(12) United States Patent
Gupta et al.

(10) Patent No.: US 9,411,374 B2
(45) Date of Patent: Aug. 9, 2016

(54) ELECTRONIC DEVICE DISPLAY STACK

(71) Applicant: Amazon Technologies, Inc., Reno, NV (US)

(72) Inventors: Siddharth Gupta, San Bruno, CA (US); Jerry Yee-Ming Chung, Los Altos, CA (US)

(73) Assignee: Amazon Technologies, Inc., Reno, NV (US)

( * ) Notice: Subject to any disclaimer, the term of this patent is extended or adjusted under 35 U.S.C. 154(b) by 51 days.

(21) Appl. No.: 14/185,708

(22) Filed: Feb. 20, 2014

(65) Prior Publication Data

US 2015/0234430 A1 Aug. 20, 2015

(51) Int. Cl.
| G06F 1/16 | (2006.01) |
| G02F 1/167 | (2006.01) |
| G06F 3/044 | (2006.01) |
| H05K 3/30 | (2006.01) |

(52) U.S. Cl.
CPC .............. G06F 1/1643 (2013.01); G02F 1/167 (2013.01); G06F 3/044 (2013.01); H05K 3/30 (2013.01); *Y10T 29/4913* (2015.01)

(58) Field of Classification Search
CPC ......... G06F 1/1643; G06F 3/044; H05K 3/30; G02F 1/167
See application file for complete search history.

(56) References Cited

U.S. PATENT DOCUMENTS

| 7,106,296 B1 * | 9/2006 | Jacobson | B41J 2/01 345/107 |
| 8,995,807 B1 * | 3/2015 | Jalava | G02B 6/34 385/37 |
| 2005/0012977 A1 * | 1/2005 | Mizuno | G02F 1/167 359/245 |
| 2005/0181533 A1 * | 8/2005 | Kawase | H01L 27/283 438/82 |
| 2008/0158143 A1 | 7/2008 | Kim et al. | |
| 2008/0309613 A1 | 12/2008 | Bae | |
| 2009/0189875 A1 * | 7/2009 | Ma | G06F 3/0416 345/174 |
| 2009/0243817 A1 | 10/2009 | Son | |
| 2009/0322705 A1 * | 12/2009 | Halsey, IV | G06F 3/044 345/174 |
| 2011/0304652 A1 * | 12/2011 | Korthuis | G02F 1/167 345/690 |
| 2011/0310053 A1 * | 12/2011 | Kim | C08L 65/00 345/174 |
| 2011/0310459 A1 * | 12/2011 | Gates | G06F 3/0412 359/296 |

FOREIGN PATENT DOCUMENTS

KR 101266677 5/2013

OTHER PUBLICATIONS

PCT Search Report and Written Opinion mailed May 15, 2015 for PCT Application No. PCT/US15/16646, 11 Pages.

* cited by examiner

*Primary Examiner* — Liliana Cerullo
(74) *Attorney, Agent, or Firm* — Lee & Hayes, PLLC

(57) ABSTRACT

This disclosure describes electronic devices that include displays for rendering content, touch sensors disposed beneath the displays for detecting touch inputs, and antiglare components for reducing glare caused by ambient light. In some embodiments, the displays include a single transparent substrate, a thin film transistor array connected to a bottom surface of the transparent substrate, a conductive substrate, and a front plane laminate connected to the conductive substrate. In such embodiments, the front plane laminate is connected to the thin film transistor array, and the array comprises a plurality of transparent electrodes. This disclosure also describes techniques for manufacturing displays utilized with electronic devices.

20 Claims, 5 Drawing Sheets

ELECTRONIC DEVICE DISPLAY STACK

BACKGROUND

A large and growing population of users is enjoying entertainment through the consumption of digital content, such as music, movies, images, electronic books, and so on. The users employ various electronic devices to consume such content. Among these electronic devices are electronic book (eBook) reader devices, cellular telephones, personal digital assistants (PDAs), portable media players, tablet computers, netbooks, and the like. As the quantity of available electronic media content continues to grow, along with increasing proliferation of devices to consume that media content, finding ways to enhance user experience continues to be a priority. For example, reducing the weight and/or the thickness of the electronic devices on which such media content is consumed can increase user satisfaction.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
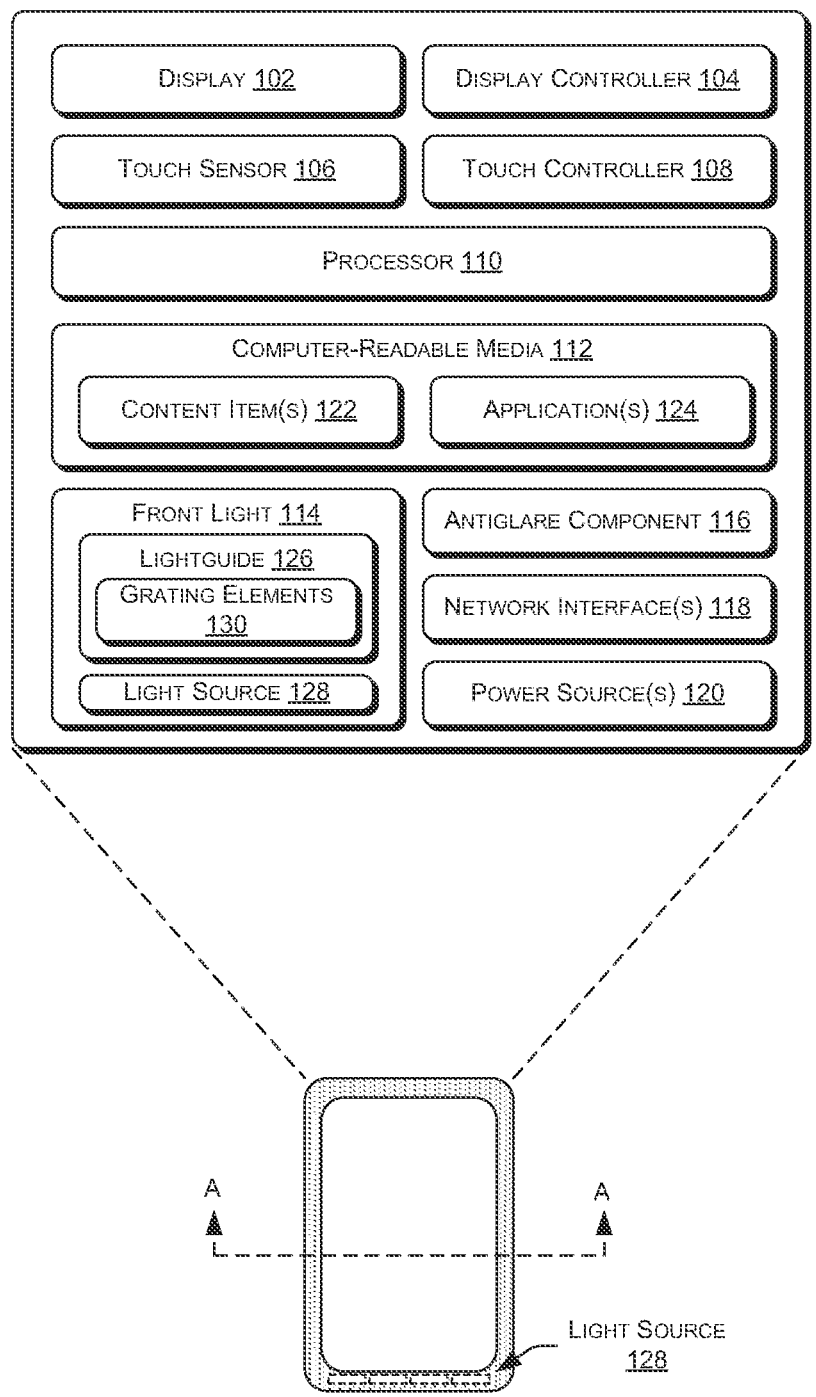
FIG. 1 illustrates an example electronic device that includes a display.

This disclosure describes, in part, electronic devices that include displays for rendering content, capacitive touch sensors disposed beneath the displays for detecting touch inputs, and antiglare components for reducing glare caused by ambient light. This disclosure also describes techniques for manufacturing electronic devices including one or more of the components mentioned above. In example embodiments, the components of the display may be selected and/or otherwise configured to minimize the weight and thickness of the display. For example, displays of the present disclosure may employ fewer layers of glass or other like substrate materials than conventional displays typically associated with electronic devices. Since, for example, fewer layers of glass or other like substrate materials are used in the displays of the present disclosure, the overall thickness and weight of the electronic device may be reduced.

In example embodiments of the present disclosure, a display may include a single transparent substrate, a thin film transistor (TFT) array connected to the transparent substrate, a separate conductive substrate, and a front plane laminate (FPL) connected to the conductive substrate. Additionally, a layer of optically clear adhesive (OCA) or other like material may be disposed between the FPL and the TFT array to connect the FPL to the TFT array.

In such embodiments, the transparent substrate may include a top surface and a bottom surface opposite the top surface. Additionally, in such embodiments the transparent substrate may be made from glass and may be positioned such that the top surface comprises an outwardly facing and/or external surface of the electronic device. For example, the top surface may face a location external to the electronic device, that is, pointing towards a user of the electronic device. In such embodiments, the top surface may comprise an outwardmost surface of the display relative to the electronic device. The bottom surface, on the other hand, may face a location internal to the electronic device. Thus, the bottom surface of the transparent substrate may face away from the user of the electronic device during use of the device.

In example embodiments, the TFT array may include a plurality of transparent electrodes. Each of the electrodes may be disposed substantially parallel to, for example, the bottom surface of the transparent substrate, and at least one of the electrodes may be connected to the bottom surface. Additionally, the electrodes may be arranged in any known array configuration so as to form a plurality of nodes of the display. For example, the TFT array may include a first plurality of transparent electrodes and a second plurality of transparent electrodes. In such an embodiment, each electrode of the first plurality of electrodes may extend substantially parallel to at least one adjacent electrode of the first plurality of electrodes, and each electrode of the first plurality of electrodes may be disposed in a first plane. Additionally, each electrode of the second plurality of electrodes may extend substantially parallel to at least one adjacent electrode of the second plurality of electrodes, and each electrode of the second plurality of electrodes may be disposed in a second plane substantially parallel to the first plane. In such embodiments, the first plurality of electrodes may be disposed substantially perpendicular to the second plurality of electrodes, and the first and second plurality of electrodes may each be disposed substantially parallel to the bottom surface of the transparent substrate. For example, the first and second planes may each be substantially parallel to the bottom surface of the transparent substrate.

In such a configuration, each of the nodes described above with respect to the TFT array may be formed at a respective location of the array in which an electrode of the first plurality of electrodes overlays and/or otherwise crosses an electrode of the second plurality of electrodes. It is understood that such nodes may assist in forming individual pixels of the displays described herein. Additionally, a desired voltage may be directed to the transparent electrodes described herein such that each node of the TFT array may take on a positive or negative electrical charge. In this configuration, the nodes of the TFT array may assist in displaying the content item.

In known displays, such TFT arrays employ electrodes made of low-cost non-transparent materials, and as a result, such arrays are typically disposed on a separate dedicated substrate located internal to the display. In example embodiments of the present disclosure, however, each electrode of the TFT array may be made from at least one of indium tin oxide (ITO), carbon nanotubes, silver nanowire, or any other like transparent conductive material. Utilizing such transparent conductive materials may enable the TFT arrays of the present disclosure to be disposed on the component of the display (i.e., the transparent substrate) acting as the cover glass of the electronic device. As a result, embodiments of the present disclosure may eliminate the need for an additional dedicated substrate for supporting the TFT array.

The conductive substrate may comprise a substantially planar non-transparent substrate configured to support the FPL on a surface thereof. In exemplary embodiments, the conductive substrate may be connected to electrical ground, and may comprise a single common electrode. Accordingly, in combination, the TFT array and the conductive substrate may act as a capacitor in some embodiments of the present disclosure.

In example embodiments, the FPL laminate may include a plurality of charged particles that are movable relative to, for example, the conductive substrate and/or other components of the display. In such embodiments, the FPL laminate may comprise any electrophoretic laminate or other like material known in the art. For example, the FPL laminate may comprise a plurality of capsules, and each may include a plurality of charged particles movably disposed therein. In such embodiments, the capsules may remain stationary relative to, for example, the conductive substrate while the particles within each capsule move.

In such embodiments, the charged particles within each capsule may include a first plurality of particles having a first color and a second plurality of particles having a second color different from the first color. For example, the first plurality of particles may be substantially white, while the second plurality of particles may be substantially black. It is understood that such colors are merely examples, and in additional embodiments, different colors may be used.

Additionally, the first plurality of particles may have a first electrical charge and the second plurality of particles may have a second electrical charge opposite from the first electrical charge. In such an embodiment, the particles within each capsule may be driven to move within the capsule by changing and/or otherwise varying the polarity at each node of the TFT array. For example, generating a positive polarity at a node of the TFT array may repel positively charged particles within one or more capsules corresponding to the node while attracting negatively charged particles within the capsule. On the other hand, generating a negative polarity at the node may repel negatively charged particles within the one or more capsules corresponding to the node while attracting positively charged particles within the capsule. It is understood that one or more capsules may "correspond" to the node if such capsules are disposed substantially directly beneath the node in the FPL. In this way, the color displayed at each node (i.e., at each pixel) of the TFT array can be controlled by controlling the polarity at each node. For example, a node having a positive polarity may be shown on the display as a white pixel while a node having a negative polarity may be shown on the display as a black pixel. It is understood that the colors of each pixel described above may be reversed depending on the electrical charge of the charged particles.

Additionally, displays of the present disclosure may include one or more capacitive touch sensors configured to receive a touch input from a user of the electronic device. In such embodiments, the capacitive touch sensor may be connected to the conductive substrate opposite the FPL. For example, the conductive substrate may include a first surface and a second surface opposite the first surface. In such embodiments, the FPL may be connected to the first surface of the conductive substrate, and such a first surface may be oriented such that the first surface faces the TFT array and/or a location external to the electronic device. Accordingly, the second surface of the conductive substrate may be disposed such that it faces a location internal to the electronic device, and the capacitive touch sensor may be connected to the second surface. Although the capacitive touch sensor may be spaced from a user of the electronic device by at least, for example, the transparent substrate, the TFT array, the FPL, and the conductive substrate, the capacitive touch sensor may still provide the electronic device with touch capability as the content item is displayed on the display and/or otherwise consumed by the user. Accordingly, example displays of the present disclosure may reduce the overall weight and thickness of the associated electronic devices in which they are used without sacrificing the functionality typically associated with such displays. Example embodiments of the present disclosure will now be described with respect to FIGS. 1-5.

FIG. 1 illustrates an example electronic device 100 that includes the display, capacitive touch sensor, and other components introduced above. The device 100 may comprise any type of mobile electronic device (e.g., an electronic book reader, a tablet computing device, a laptop computer, a multifunction communication device, a portable digital assistant (PDA), etc.) or non-mobile electronic device (e.g., a desktop computer, a television, etc.). In addition, while FIG. 1 illustrates several example components of the electronic device 100, it is to be appreciated that the device 100 may also include other conventional components, such as an operating system, system busses, input/output components, and the like.

Regardless of the specific implementation of the electronic device 100, the device 100 includes a display 102 and a corresponding display controller 104. The display 102 may represent a reflective display in some instances, such as an electronic paper display, a reflective LCD display or the like.

Electronic paper displays represent an array of display technologies that largely mimic the look of ordinary ink on paper. In contrast to conventional backlit displays, electronic paper displays typically reflect light, much as ordinary paper does. In addition, electronic paper displays are often bi-stable, meaning that these displays are capable of holding text or other rendered images even when very little or no power is supplied to the display.

In one implementation, the display 102 comprises an electrophoretic display that moves particles between different positions to achieve different color shades. For instance, in an embodiment in which the display 102 is free from a color filter, the display 102 may be configured to produce the color white when the particles within a component of the display 102 are located at the front (i.e., viewing) side of the display. For example, particles of the display 102 may be associated with and/or may otherwise correspond to an individual "pixel" of the display 102, and each pixel may be controlled individually to produce a desired color at the pixel. In the above example, when particles of a given pixel are located at the front side of the display 102, the particles reflect incident light, thus giving the appearance of a white pixel. Conversely, when the particles are pushed near the rear of the display, the particles absorb the incident light and, hence, cause the pixel to appear black to a viewing user. For example, when such particles are pushed near the rear of the display, a non-transparent oil or other like substance in which the particles are immersed may assist in absorbing the incident light and, hence, cause the corresponding pixel to appear black. In addition, the particle may situate at varying locations between the front and rear sides of the display to produce varying shades of gray. Furthermore, as used herein, a "white" pixel may comprise any shade of white or off white, while a "black" pixel may similarly comprise any shade of black.

In another implementation, the display 102 comprises an electrophoretic display that includes oppositely charged light and dark particles. In order to create a white pixel, the display controller 104 may move the light particles to the front side of the display 102 by creating a corresponding charge at an electrode node near the front and moves the dark particles to the back of the display 102 by creating a corresponding charge at an electrode node near the back of the display 102. In order to create black, meanwhile, the display controller 104 changes the polarities and moves the dark particles to the front and the light particles to the back. Furthermore, to create varying shades of gray, the display controller 104 may utilize different arrays of both light and dark particles.

In still another implementation, the display 102 comprises an electrowetting display that employs an applied voltage to change the surface tension of a liquid in relation to a surface. For instance, by applying a voltage to a hydrophobic surface, the wetting properties of the surface can be modified so that the surface becomes increasingly hydrophilic. As one example of an electrowetting display, the modification of the surface tension acts as an optical switch by contracting a colored oil film when a voltage is applied to individual pixels of the display. When the voltage is absent, the colored oil forms a continuous film within a pixel, and the color may thus be visible to a user of the display. On the other hand, when the voltage is applied to the pixel, the colored oil is displaced and the pixel becomes transparent. When multiple pixels of the display are independently activated, the display 102 can present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video content. In addition, the lower power consumption of electrowetting displays in comparison to conventional LCD displays makes the technology suitable for displaying content on portable devices that rely on battery power.

While several different examples have been given, it is to be appreciated that the displays 102 described herein may comprise any other type of electronic-paper technology or reflective-display technology, such as gyricon displays, electrowetting displays, electrofluidic displays, interferometric modulator displays, cholestric liquid crystal displays, and the like. In addition, while some of the examples described above are discussed as rendering black, white, and varying shades of gray, it is to be appreciated that the described techniques apply equally to displays capable of rendering color pixels. As such, the terms "white", "gray", and "black" may refer to varying degrees of color in implementations utilizing color displays. For instance, where a pixel includes a red color filter, a "gray" value of the pixel may correspond to a shade of pink while a "black" value of the pixel may correspond to a darkest red of the color filter. Further details of example displays 102 of the present disclosure will be discussed below with respect to FIGS. 2-4.

In addition to including the display 102, FIG. 1 illustrates that the device 100 includes a touch sensor 106 and a touch controller 108. In some instances, at least one touch sensor 106 resides beneath the display 102 to form a touch-sensitive display (e.g., an electronic paper touch-sensitive display) that is capable of both accepting touch input from a user of the electronic device 100 and rendering content corresponding to the input. As described in further detail below, the touch sensor 106 may reside on a conductive substrate of the display 102, and the conductive substrate and the touch sensor 106 may be spaced from the user by various components of the display 102.

The touch sensor 106 may comprise a capacitive touch sensor, a force sensitive resistance (FSR) sensor, an interpolating force sensitive resistance (IFSR) sensor, or any other type of touch sensor. In some instances, the touch sensor 106 is capable of detecting touches as well as determining an amount of pressure or force of these touches. In examples described below, the touch sensor 106 comprises a capacitive touch sensor unless otherwise specified. In such embodiments, the touch sensor 106 may direct signals including information indicative of such touches and/or indicative of the amount of pressure or force of such touches to the touch controller 108. The touch controller 108 may communicate and/or otherwise cooperate with the display controller 104 to assist in rendering content corresponding to the touch input.

FIG. 1 further illustrates that the electronic device 100 includes one or more processors 110 and a memory comprising computer-readable media 112. The electronic device 100 may also include one or more of a front light 114 for lighting the display 102, an antiglare component 116 for reducing glare of incident light, one or more network interfaces 118, and one or more power sources 120. The network interfaces 118 may support both wired and wireless connection to various networks, such as cellular networks, internet, radio, WiFi® networks, short range networks (e.g., Bluetooth®), infrared, and so forth.

Depending on the configuration of the electronic device 100, the computer-readable media 112 (and other computer-readable media described throughout) is an example of computer storage media and may include volatile and nonvolatile memory. Thus, the computer-readable media 112 may include, but is not limited to, RAM, ROM, EEPROM, flash memory, or other memory technology, or any other medium which can be used to store media items or applications and data which can be accessed by the electronic device 100.

The computer-readable media 112 may be used to store any number of functional components that are executable on the processors 110, as well content items 122 and applications 124. Thus, the computer-readable media 112 may include an operating system and a storage database to store one or more content items, such as eBooks, audio books, songs, videos, still images, and the like. The computer-readable media 112 of the electronic device 100 may also store one or more content presentation applications to render content items on the device 100. These content presentation applications may be implemented as various applications depending upon the content items. For instance, the application may be an electronic book reader application for rending textual electronic books, an audio player for playing audio books or songs, a video player for playing video, and so forth.

In some instances, the electronic device 100 may couple to a cover (not shown) to protect the display 102 (and other components in the stack) of the device 100. In one example, the cover may include a back flap that covers a back portion of the device 100 and a front flap that covers the display 102 and the other components in the stack. The device 100 and/or the cover may include a sensor (e.g., a hall effect sensor) to detect when the cover is open (i.e., when the front flap is not atop the display and other components). The sensor may send a signal to the front light 114 when the cover is open and, in response, the front light 114 may illuminate the display 102. When the cover is closed, meanwhile, the front light 114 may receive a signal indicating that the cover has closed and, in response, the front light 114 may turn off.

Furthermore, the amount of light emitted by the front light 114 may vary. For instance, upon a user opening the cover, the light from the front light may gradually increase to its full illumination. In some instances, the device 100 includes an ambient light sensor and the illumination of the front light 114 may be based at least in part on the amount of ambient light detected by the ambient light sensor. For instance, the front light 114 may be brighter if the ambient light sensor detects relatively little ambient light, and may be dimmer if the ambient light sensor detects a relatively large amount of ambient light.

In addition, the settings of the display 102 may vary depending on whether the front light 114 is on or off, or based on the amount of light provided by the front light 114. For instance, the electronic device 100 may implement a larger default font or a greater contrast when the light is off compared to when the light is on. In some instances, the electronic device 100 maintains, when the light is on, a contrast ratio for the display 102 that is within a certain defined percentage of the contrast ratio when the front light 114 is off.

As described above, the touch sensor 106 may comprise a capacitive touch sensor that resides beneath various components of the display 102. The front light 114, meanwhile, may reside atop or beneath the capacitive touch sensor 106. In some instances, the front light 114 couples to a top surface of the capacitive touch sensor 106 via optically clear adhesive (OCA), such as a solid OCA or a liquid OCA. In the latter instances, the device 100 may be assembled by placing the OCA atop the touch sensor 106 and, when the OCA reaches the corner(s) and/or at least a portion of the perimeter of the touch sensor 106, UV-curing the OCA on the corners and/or the portion of the perimeter. Thereafter, the remaining OCA may be UV-cured and the front light 114 may couple to the OCA. By first curing the corner(s) and/or perimeter, the techniques effectively create a barrier for the remaining OCA and also prevent the formation of air gaps in the OCA layer, thereby increasing the efficacy of the front light 114 and/or other components of the display 102. In other implementations, the OCA may be placed near a center of the top surface of the touch sensor 106, pressed outwards towards a perimeter of the top surface of the touch sensor 106 and cured. It is understood that like techniques may also be utilized for connecting any of the other components of the display 102 described herein using OCA.

As illustrated, the front light 114 includes a lightguide 126 and a light source 128. The lightguide 126 comprises a substrate (e.g., a transparent thermoplastic such as PMMA), a layer of lacquer and multiple grating elements 130 that function to propagate light from the light source 128 towards the display 102, thus illuminating the display 102. To create the grating elements, the layer of lacquer may be applied to the substrate of the lightguide 126, the grating elements may be embossed to the layer of lacquer, and the lightguide 126 may be UV-cured. Alternatively, the substrate of the lightguide and the grating elements may be manufactured as a single element, such as via an injection molding process. In some instances, the UV lacquer is made of a cross-linked, trifunctional polymer material that co-polymerizes to a plastic solid when exposed to a high-intensity UV light source.

The light source 128 may comprise one or more (e.g., four) LEDs, which may reside toward a bottom edge of the electronic device. By positioning the LEDs along the bottom portion of the display 102 relative to the content being displayed, light from the light source 128 is generally directed away from a user consuming the content and, hence, is not directed into the user's eyes. That is, because users typically hold the device 100 with the top edge further away from the user's eyes than the bottom edge (i.e., with the top edge tilted away from the user, given the user's line of sight to the top edge), the LEDs positioned on the bottom of the display 102 will generally shine towards the top edge and away from the user's eyes. As such, positioning the LEDs in this manner may decrease the chances of the light being directed into a user's eyes.

The antiglare component 116 may comprise a film that functions to reduce glare of ambient light incident on the electronic device 100. In some instances, the antiglare component 116 may comprise a hard-coated polyester and polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3 h pencil). Without such scratch resistance, the display 102 may be more easily scratched and a user may perceive the scratches from the light that is dispersed over the top of the display 102. The antiglare component 116 may couple to a top surface of the display 102 via OCA. The antiglare component 116 may, in some instances, also include a UV filter for the purpose of protecting components lower in the stack of the display 102 from UV of the light incident on the electronic device 100. In still further embodiments, the antiglare component 116 may be omitted, and instead, one or more surfaces of the display 102 may be etched, chemically treated, and/or otherwise processed to provide reduce glare of ambient light incident on the display 102 and/or to otherwise provide antiglare functionality.

While FIG. 1 illustrates various example components, the electronic device 100 may have additional features or functionality. For example, the device 100 may also include additional data storage devices (removable and/or non-removable) such as, for example, magnetic disks, optical disks, or tape. The additional data storage media may include volatile and nonvolatile, removable and non-removable media implemented in any method or technology for storage of information, such as computer readable instructions, data structures, program modules, or other data. In addition, some or all of the functionality described as residing within the device 100 may reside remotely from the device 100 in some implementations. In these implementations, the device 100 may utilize the network interfaces 118 to communicate with and utilize this functionality.

Figure 2:
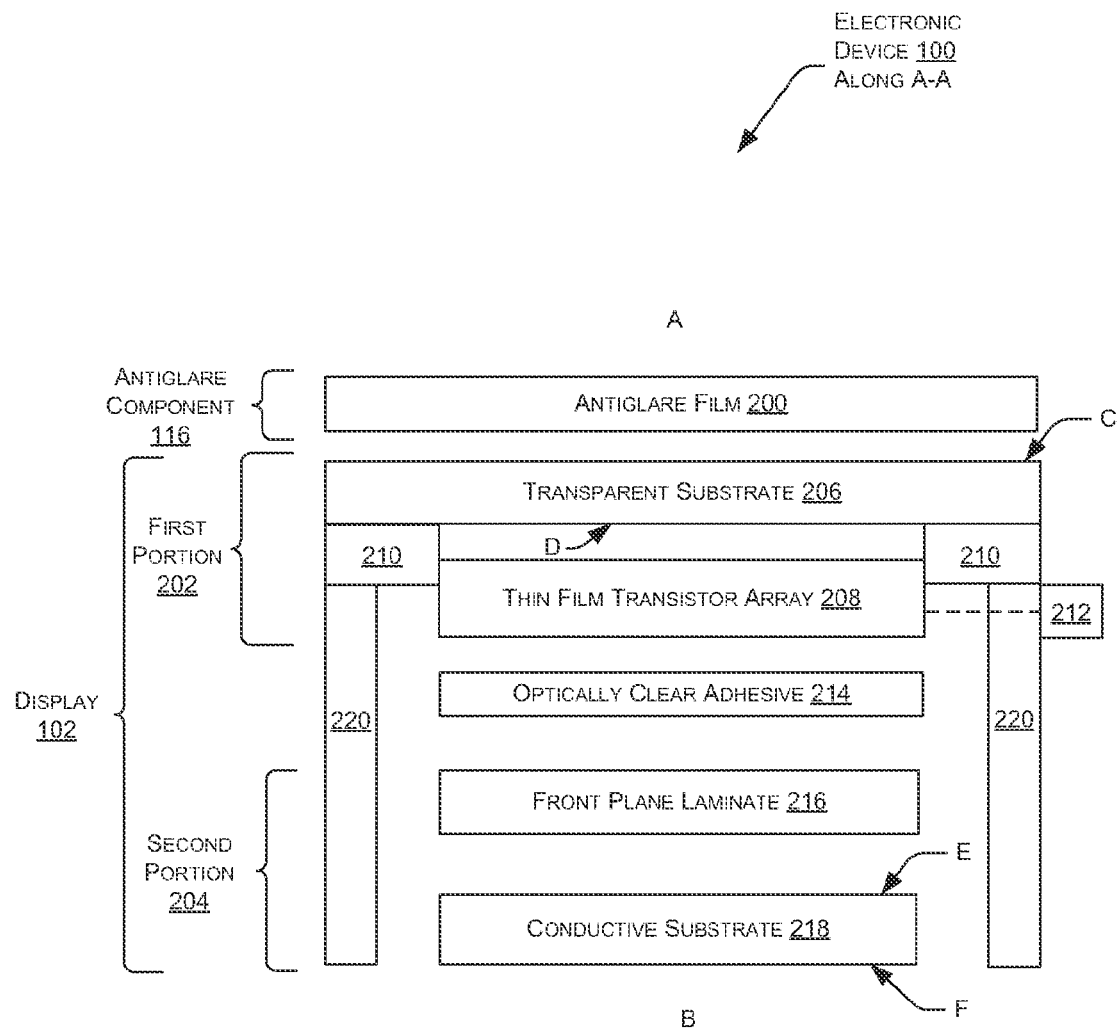
FIG. 2 illustrates an example schematic cross-section of the electronic device of FIG. 1.

FIG. 2 illustrates a first example of a schematic cross-section of the electronic device 100 along the line A-A from FIG. 1. The cross-section shown in FIG. 2 illustrates an antiglare film 200 of the antiglare component 116 residing atop the display 102. It is understood that the touch sensor 106, the front light 114, an external housing of the electronic device 100, and other components of the electronic device 100 have been omitted from FIG. 2 for clarity, and the example partial cross-section illustrated in FIG. 2 should not be interpreted as limiting the present disclosure. Additionally, the partial cross-section shown in FIG. 2 is intended to be schematic in nature, and the spaces between the various components shown in FIG. 2 are shown merely for ease of illustration.

Further, FIG. 2 illustrates a location A external to the electronic device 100 and a location B internal to the electronic device 100. Accordingly, a first component of the display 100 described herein as residing "atop" or "above" a second component may be disposed closer to the location A than the secondary component. Likewise, a first component of the display 102 described herein as residing "beneath" or "below" a second component may be disposed closer to the location B than the second component. Additionally, the location A may correspond to and/or may be indicative of a location of a user of the device 100 as content items are shown on the display 102 and/or otherwise consumed by the user. In example embodiments, content items shown on the display 102 may be viewed by the user of the device 100 located at position A. Thus, surfaces or other portions of the components of the display 102 described herein as being "outwardly-facing" may be disposed facing the location A, while such components described herein as being "inwardly-facing" may be disposed facing the location B.

As illustrated in FIG. 2, in this example the display 102 includes a first portion 202 and a second portion 204. The first and second portions 202, 204 may be manufactured separately, and may be connected during assembly and/or manufacture of the display 102. For example, the first portion 202 may comprise a first plurality of components of the display 102 that are joined, adhered, fused, laminated, coupled, sputtered, welded, soldered, bonded, wired, and/or otherwise connected together during manufacture of the first portion 202. As used herein, the term "connected" may include any of the above mechanical connection methods, and may also include any other known mechanical, electrical, chemical, wireless, networked, communicative, and/or other known connection methods. Additionally, the second portion 204 may comprise a second plurality of components of the display 102 that are connected together during manufacture of the second portion 204. Such configurations may simplify the assembly and/or manufacture of the display 102.

As shown in FIG. 2, the first portion 202 of the display 102 may comprise a transparent substrate 206 and a thin film transistor (TFT) array 208. The display 102 may also include a non-transparent mask 210 and a flexible printed circuit board (PCB) 212. In such embodiments, the PCB 212 may be disposed adjacent to the TFT array 208. It is understood that "transparent" components of the device 100 may substantially permit the passage of visible light therethrough, while "non-transparent" components of the device 100 may substantially block the passage of visible light therethrough. Additionally, the non-transparent mask 210 may be disposed adjacent to the TFT array 208, and may be disposed between the transparent substrate 206 and the PCB 212. For example, the transparent substrate 206 may include a top surface C and a bottom surface D opposite the top surface C. The top surface C may be disposed facing the location A external to the electronic device 100 and the bottom surface D may be disposed facing the location B internal to the electronic device 100. In such embodiments, the top surface C may comprise an outward-most surface of the display 102 relative to the electronic device 100. Accordingly, the top surface C may be an external surface of the display 102 and/or of the electronic device 100 in which the display 102 is used. As such, the top surface C may be disposed closer to the location A external to the electronic device 100 than any other portion, section, or component of the display 102. In such embodiments, the non-transparent mask 210 may be disposed between the bottom surface D of the transparent substrate 206 and the PCB 212. Additionally, the majority of the top surface C may face the location A external to the electronic device 100 in embodiments in which a perimeter or other relatively small portion of the top surface C is at least partially covered by, for example, one or more brackets, clamps, shoulders, notches, housings, or other like components of the electronic device 100. In embodiments of the present disclosure, the top surface C may comprise a viewing pane of the transparent substrate 206, and a user of the electronic device 100 may view the bottom surface D (to the extent possible) and/or other components of the display 102 through the top surface C. For example, content items shown on the display 100 may be visible by the user via the top surface C.

Further, as shown in FIG. 2, the first portion 202 may be connected to the second section 204 via a layer of OCA 214 disposed therebetween. For example, the second portion 204 may include a front plane laminate (FPL) 216 and a conductive substrate 218. The conductive substrate 218 may include a first (i.e., a top) surface E and a second (i.e., a bottom) surface F opposite the first surface E. In such embodiments, the FPL 216 may be connected to the first surface E of the conductive substrate 218. Likewise, the FPL 216 may be connected to the TFT array 208 via a layer of OCA 214 disposed between the TFT array 208 and the FPL 216. In an example embodiment, the FPL 216 may include a plurality of capsules (described in greater detail below with respect to FIG. 3), each containing liquid subject to electrowetting activation. For example, voltage may be applied to the TFT array 208 to change the position of particles within each capsule. Such particles may assist in displaying portions of a content item on the display 102. The display 102 may also include one or more layers of edge glue 220 and/or other like materials disposed around and/or on the corners, perimeters, and/or edges of the components of the display 102. Such edge glue 220 be similar to the OCA 214 described above and may be cured to the components of the display 102 to create a humidity barrier around such components, thereby increasing the efficacy of the display 102.

With continued reference to FIG. 2, the transparent substrate 206 may be made from any transparent non-conductive material known in the art. In some embodiments, the transparent substrate 206 may be made from glass or any other like substrate material commonly used in electronic devices 100. For example, the transparent substrate 206 may comprise a transparent glass substrate commonly referred to as "cover glass" in known electronic devices 100. The transparent substrate 206 may have a thickness of approximately 0.7 mm or less, and may be reinforced through chemical, mechanical, and or other known processes during the manufacture thereof. In exemplary embodiments, the transparent substrate 206 may have a substantially uniform thickness and the top and bottom surfaces C, D thereof may be substantially planar surfaces. Accordingly, the top surface C may be substantially parallel to the bottom surface D, and the top surface C may comprise an external surface of the electronic device 100. In some embodiments of the present disclosure, the transparent substrate 206 may be the only glass substrate and/or other like transparent substrate used in the electronic device 100.

The TFT array 208 may comprise a plurality of transparent electrodes. Such electrodes may comprise conductive electrodes and may be made from any transparent conductive material known in the art. For example, such electrodes may be made from at least one of indium tin oxide (ITO), carbon nanotubes, silver nanowire, and/or any other known transparent conductive material. Such example electrodes 300, 302 of the TFT array 208 are illustrated in FIG. 3.

Figure 3:
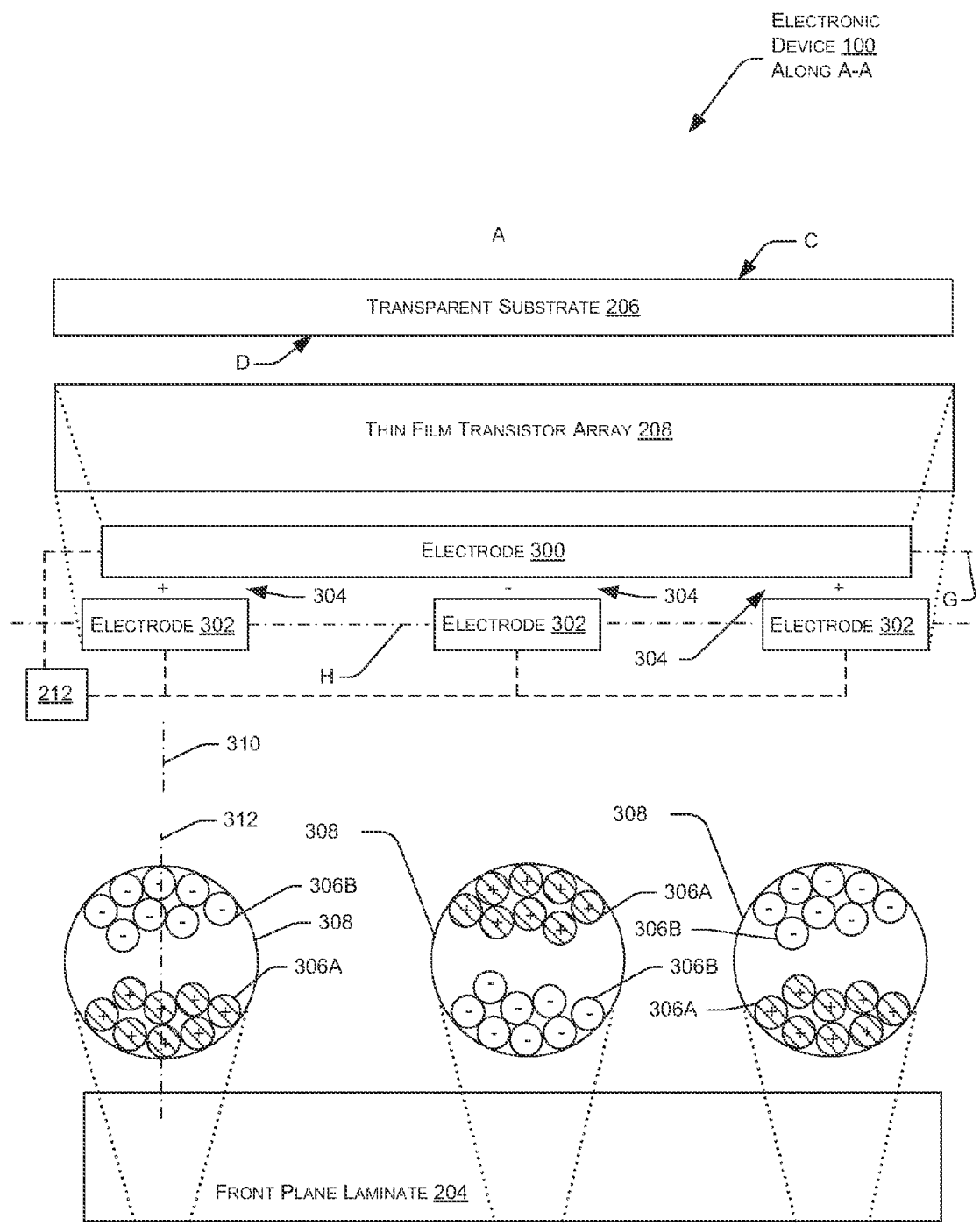
FIG. 3 illustrates an example schematic cross-section of a portion of a display.

As shown in FIG. 3, the plurality of transparent conductive electrodes 300, 302 may form a plurality of nodes 304 of the corresponding display 102. In such embodiments, at least one electrode of the plurality of electrodes 300, 302 may be connected to the bottom surface D of the transparent substrate 206. In further embodiments, each electrode 300, 302 of the plurality of electrodes described herein may be connected to the bottom surface D. For example, during manufacture of the first portion 202 of the display 102, the electrodes 300, 302 may be connected to the bottom surface D via any known sputtering process or other like technique.

Additionally, the plurality of transparent electrodes described herein may comprise a first plurality of electrodes 300 disposed in a first plane G, and a second plurality of electrodes 302 disposed in a second plane H substantially parallel to the first plane G. In such an embodiment, each electrode 300 of the first plurality of electrodes may extend substantially parallel to at least one adjacent electrode 300 of the first plurality of electrodes. Likewise, each electrode 302 of the second plurality of electrodes may extend substantially parallel to at least one adjacent electrode 302 of the second plurality of electrodes.

Further, the first plurality of electrodes 300 may be disposed substantially perpendicular to the second plurality of electrodes 302. For example, as shown in FIG. 3, the first plurality of electrodes 300 may extend in a first direction in the first plane G, such as from left to right across the page, and the second plurality of electrodes 302 may extend in a second direction in the second plane H, such as into and out of the page. In addition, the first and second planes G, H, and the electrodes 300, 302 disposed therein, may be disposed substantially parallel to the bottom surface D of the transparent substrate 206.

In such embodiments, each node 304 of the plurality of nodes may be formed formed at a respective location in which an electrode 300 of the first plurality of electrodes overlays an electrode 302 of the second plurality of electrodes. It is understood, that such locations may comprise locations in the TFT array 208 in which an individual electrode 300 of the first plurality of electrodes is disposed atop or beneath a corresponding individual electrode 302 of the second plurality of electrodes. It is also understood that an electrode 300 residing atop an electrode 302 may be disposed closer to the location A than the corresponding electrode 302. Likewise, an electrode 300 residing beneath an electrode 302 may be disposed closer to the location B than the corresponding electrode 302.

As shown schematically in FIG. 3, each electrode 300, 302 may be connected to the flexible PCB 212 described above. In exemplary embodiments, the PCB 212 may include the display controller 104 and/or other components of the electronic device 100 configured to control display of one or more content items on the display 102. For example, the display controller 104 may be mounted to and/or otherwise connected to the PCB 212. In such embodiments, the display controller 104 and/or other components of the PCB 212 may direct electrical current to the electrodes 300, 302 of the TFT array 208 at any desired voltage. Further, the electrical current directed to the electrodes 300, 302 may produce a desired polarity at each individual node 304 of the plurality of nodes. In particular, as will be described in greater detail below, the polarity at each individual node 304 may be controlled to assist in controlling display of a content item on the display 102.

For purposes of discussion, positive (+) and negative (−) polarities are shown at the nodes 304 illustrated in FIG. 3. In such embodiments, the display controller 104 and/or other components of the PCB 212 may be configured to selectively vary and/or otherwise control the polarity at each node 304. For example, the polarity at a node 304 may be selectively varied by selectively varying the polarity of the electrical current directed to at least one of the electrodes 300, 302 corresponding to (i.e., forming) the node 304.

With continued reference to FIG. 3, the FPL 204 connected to the conductive substrate 218 described above may include a plurality of charged particles 306A, 306B (collectively, "charged particles 306"). In such embodiments, each of the charged particles 306 may be movably disposed within the FPL 204. For example, each of the charged particles 306 may be movable relative to the conductive substrate 218 and/or other components of the display 102. Such movement may be in a direction toward the location A external to the electronic device 100 and/or toward the location B internal to the electronic device 100. Alternatively, such movement may be in additional directions, such as directions into or out of the page, or other directions substantially parallel to one of the first or second plane G, H.

In embodiments of the present disclosure, the FPL 204 described herein may comprise any film, laminate, or other like material including one or more components moveable within and/or relative to the material in response to an electrical charge. In example embodiments, the FPL 204 may include at least one substantially transparent, substantially hollow capsule 308. In such embodiments, a plurality of charged particles 306 may be movably disposed within each capsule 308 of the FPL 204. In such embodiments, each capsule 308 of the FPL 204 may be disposed at a respective fixed location within the FPL 204. Alternatively, in additional exemplary embodiments, one or more of the capsules 308 may be movably disposed within the FPL 204. In any of the embodiments described herein, one or more capsules 308 of the FPL 204 may "correspond" to a single node 304 of the TFT array 208. Such capsules 308 may correspond to a respective node 304 by nature of being disposed substantially directly beneath the respective node 304. For example, in such embodiments a polar and/or other magnetic axis 310 of the respective node 304 may extend substantially collinear with a central axis 312 of the corresponding capsule 308. Each capsule 308 may be spherical, cylindrical, cubic, pyramidal, and/or any other known three-dimensional shape, and the central axis 312 of each capsule 308 may extend substantially centrally and/or substantially longitudinally therethrough. It is understood that in further exemplary embodiments in which the FPL 204 does not include individual capsules 308, one or more charged particles 306 may "correspond" to a single node 304 of the TFT array 208 by nature of being disposed substantially directly beneath the node 304 and/or by being disposed substantially along and/or proximate the magnetic axis 310 of the respective node 304.

In any of the embodiments described herein, each node 304, together with the one or more charged particles 306 and/or the one or more capsules 308 corresponding to the node 304, may form and/or otherwise comprise an individual pixel of the display 102. As is common in most displays, the display 102 of the present disclosure may include a plurality of pixels configured to assist in displaying the content item on the display 102.

In example embodiments, the plurality of transparent electrodes 300, 302 may be operable to drive movement of at least one of the charged particles 306 at each respective node 304. For example, as noted above the electrodes 300, 302 may be configured to selectively vary the polarity at each node 304, and varying the polarity at a node 304 may drive movement of one or more of the charged particles 306 corresponding to the respective node 304. As shown in FIG. 3, the plurality of charged particles 306 may include a first plurality of charged particles 306A having a first color and a second plurality of charged particles 306B having a second color different from the first color. In such embodiments, the first color of the charged particles 306A may be black while the second color of the second plurality of charged particles 306B may be white. Alternatively, such example colors of the charged particles 306A, 306B may be reversed or otherwise changed depending on the application in which the display 102 is used. For example, it is understood that the charged particles 306 may have any color known in the art.

Additionally, the first plurality of charged particles 306A may have a first electrical charge and the second plurality of charged particles 306B may have a second electrical charge opposite the first electrical charge. In such embodiments, the first electrical charge of the charged particles 306A may be may be positive (+) and the second electrical charge of the second plurality of charged particles 306B may be negative (−). Alternatively, such example electrical charges may be reversed in additional embodiments of the present disclosure. In such embodiments, varying the polarity at a node 304 may drive movement of the first and second plurality of charged particles 306A, 306B. For example, a node 304 having a positive polarity may attract charged particles 306B having a negative electrical charge and may repel charged particles 306A having a positive electrical charge. Thus, varying and/or otherwise changing the polarity of the node 304, such that the node 304 has a negative polarity, may attract charged particles 306A having a positive electrical charge and may repel charged particles 306B having a negative electrical charge.

Since, as noted above, the charged particles 306 may have different colors, the color of each node 304 (i.e., of each pixel) may be controlled by controlling the polarity at each node 304. For example, controlling the polarity of a node 304 such that white charged particles 306B corresponding to the node 304 are disposed toward the front of the FPL 204 (i.e., toward the location A external to the electronic device 100) may cause the node 304 (i.e., the pixel) to appear white on the display 102. Alternatively, controlling the polarity of the node 304 such that black charged particles 306A corresponding to the node 304 are disposed toward the front of the FPL 204 may cause the node 304 (i.e., the pixel) to appear black on the display 102. It is understood that the FPL 204 is visible through the TFT array 208 and through the transparent substrate 206. For example, a user of the electronic device 100 may view the charged particles 306 of the FPL 204, from the location A external to the device 100, through the top surface C of the transparent substrate 206.

With continued reference to FIG. 2, the conductive substrate 218 may comprise a thin, substantially planar substrate made from any conductive material known in the art. For example, the conductive substrate 218 may be made from aluminum, copper, titanium, gold, and/or any other like metals or alloys. In some embodiments, the conductive substrate 218 may comprise a non-transparent conductive substrate. In such embodiments, the substrate 218 may be non-transparent due to its location beneath, for example, the FPL 216 and/or the TFT array 208. Additionally, the conductive substrate 218 may be connected to electrical ground, and may comprise a common electrode of the display 102. For example, as described above, the conductive substrate 218, together with the TFT array 208, may be operable as a capacitor of the display 102. In such an embodiment, electrical current directed to the conductive substrate 218 by, for example, the TFT array 208 may be directed to ground by the conductive substrate 218. Additionally, the conductive substrate 218 may comprise a relatively low cost substrate onto which the FPL 216 may be connected.

In example embodiment, the TFT array 208 and/or the FPL 216 may be filled with liquid and/or solid OCA 214. In such embodiments, the OCA 214 may connect, for example, the FPL 216 to the TFT array 206. In such embodiments, the OCA 214 may also substantially eliminate the opportunity for air gaps to form between the first portion 202 and the second portion 204 of the display 102. As is known, air gaps may hinder the performance of the resulting display 102.

During assembly, liquid OCA 214 may be deposited onto the TFT array 208 and/or the FPL 216. When the liquid OCA 214 reaches the corners of the TFT array 208 and/or the FPL 216, the corners may be UV-cured. Thereafter, liquid OCA 214 on the remaining portion of the TFT array 208 and/or the FPL 216 may be UV-cured. While this example includes liquid OCA 214, in other instances the liquid OCA 214 may be replaced with a solid OCA 214. In either instance, the OCA 214 may be formed from an acrylic material and/or, in some instances, from silicone. For instance, the OCA 214 may comprise Loctite® 5192 and/or MSDS made by Nalax3®. The MSDS comprises UV-curable polyurethane acrylates based a formulation comprising of hexamethylene diacrylate, Urethane acrykate oligomer, Acyrlate ester and photoinitator. This formulation may achieve balanced coating properties such as tensile properties, hardness, weatherability, and adhesion. In some embodiments, the OCA 214 may be created by applying the formulation to PMMA rolls using a wet coating method immediately followed by embossing and UV curing (e.g., using a Fusion lamp).

The non-transparent mask 210 may comprise, for example, white tape, black tape, and/or any other type of light-diffusing, reflective, or light-absorbing coating. For example, such a non-transparent mask 210 may be laid along and/or proximate to a perimeter of the transparent substrate 206. Although illustrated as being connected to the bottom surface D of the transparent substrate 206 in FIG. 2, in additional embodiments, the non-transparent mask 210 may be connected to the top surface C.

In some instances, the electronic device 100 may also include a bezel, either atop, beneath, or in lieu of the non-transparent mask 210. In either instance, the bezel may be optically connected to the other components of the display 102 and/or to the antiglare component 116. The bezel may function to absorb stray ambient light and may therefore enhance the user experience. To absorb light in this manner, in some instances the bezel may be black or another dark color. Additionally or alternatively, the non-transparent mask 210 may include black or dark glue, ink, paint, marker, adhesive, or other like materials around the edges of the transparent substrate 206 and/or other components of the display 102 to similarly reduce reflections off of the edges of the various components of the display 102 (i.e., to reduce the amount of light that escapes).

In some instances, the top-most surface of the stack (e.g., a surface of the antiglare component 116 in this implementation) may be treated to provide a particular feel or roughness, such as a feel or roughness that substantially approximates that of paper or that otherwise enhances a feel of the device. In some instances, the top surface is etched, abraded, polished or otherwise treated to provide this feel or roughness.

In one implementation, the resulting stack of components illustrated in FIG. 2 has a thickness of approximately 1.5 millimeters or less. The transparent substrate 206 may have a thickness of approximately 0.7 mm, the TFT array 208 may have a thickness of approximately 250 microns, and the OCA 214 deposited thereon may have an approximate thickness of 130 microns. The conductive substrate 218 may have an approximate thickness of 506 microns, while the FPL 216 thereon may have a thickness of approximately 100 microns. Finally, the antiglare film 200 may have an approximate thickness of 195 microns.

Figure 4:
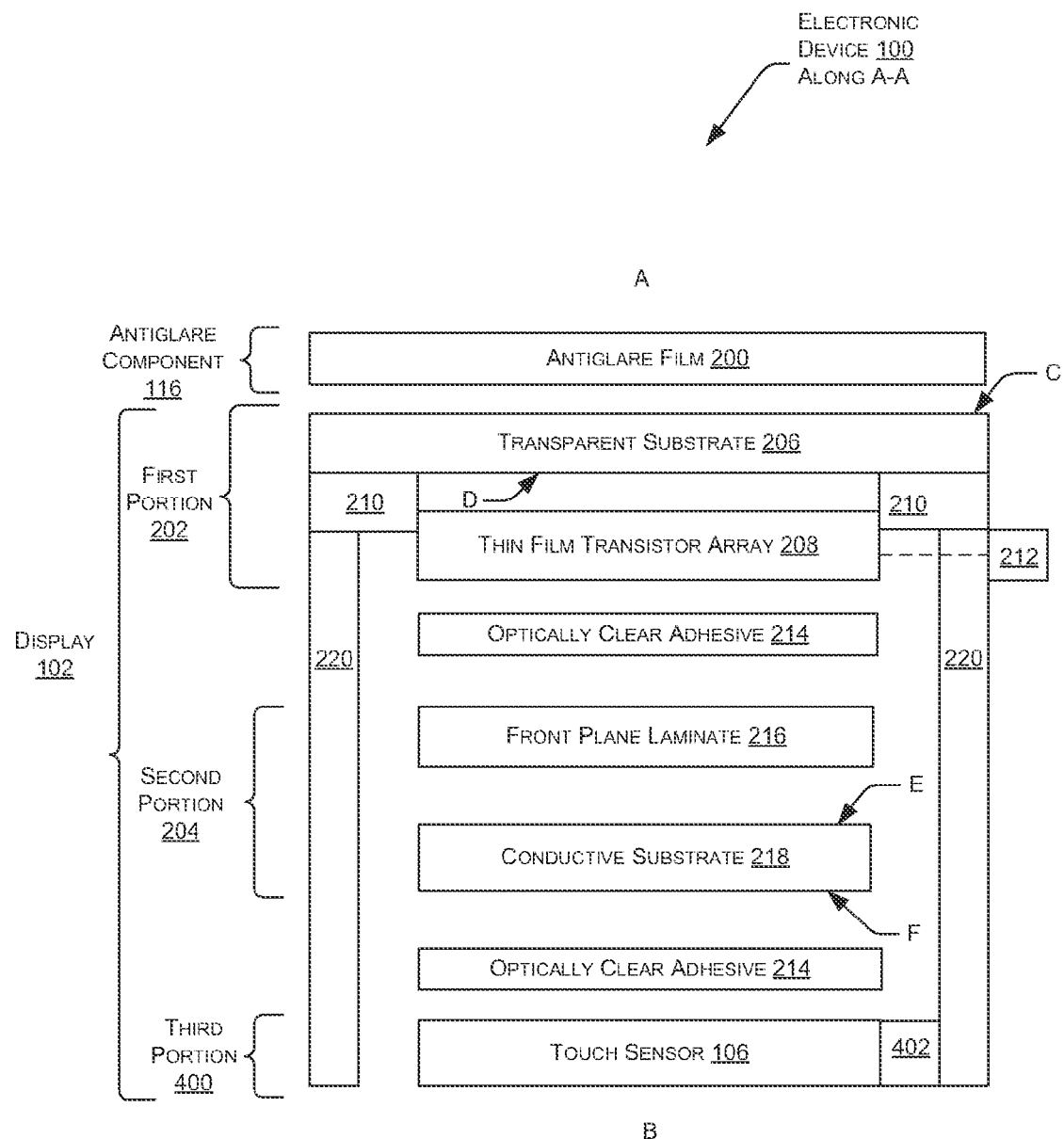
FIG. 4 illustrates another example schematic cross-section of the electronic device of FIG. 1.

FIG. 4 illustrates an additional example partial cross-section of the electronic device 100 across the line A-A from FIG. 1. The partial cross-section shown in FIG. 4 is intended to be schematic in nature, and the spaces between the various components shown in FIG. 4 are shown merely for ease of illustration. The cross-section shown in FIG. 4 again illustrates the antiglare component 116 residing atop the transparent substrate 206, which resides atop the TFT array 208. FIG. 4 also illustrates the FPL 216 which resides atop the conductive substrate 218, and which is connected to the TFT array 208 via a first layer of OCA 214. Additionally, while the FPL 216 is connected to the first surface E of the conductive substrate 218, FIG. 4 also illustrates a touch sensor 106 connected to the second surface F of the conductive substrate 218 via a second layer of OCA 214. As noted above, the touch sensor 106 may comprise a capacitive touch sensor configured to receive touch input from, for example, a user of the electronic device 100.

In the embodiment shown in FIG. 4, the touch sensor 106 and/or components thereof, may comprise a third portion 400 of the display 102. In such embodiments, the third portion 400 may be connected to, for example, the second portion 204 by the second layer of OCA 214. Additionally, in such embodiments a flexible printed circuit board (PCB) 402 may be connected to the touch sensor 106, and the touch controller 108 described above with respect to FIG. 1 may be mounted to and/or otherwise connected to the PCB 402. In such embodiments, the touch controller 108 may be connected to the touch sensor 106 and may be configured to receive signals from the touch sensor 106 indicative of a touch input by the user. Further, as noted above, the touch controller 108 and/or the display controller 104 may be configured to control display of one or more content items on the display 102 in response to such signals and/or in response to the touch input. Additionally, in some embodiments, the edge glue 220 may extend to and/or may otherwise be cured on a perimeter of the touch sensor 106, while in other embodiments, the edge glue 220 may extend only as far as the conductive substrate 218. In such embodiments, the edge glue 220 may not contact and/or be cured on the touch sensor 106.

In example embodiments, the touch sensor 106 may comprise a substrate (not shown), such as a glass substrate, or other like structure configured to support one or more conductive traces of the sensor 106. In embodiments in which the touch sensor 106 comprises a capacitive touch sensor, traces made from indium tin oxide, copper, printed ink, or other like metallic materials may be utilized. Such traces may be arranged in, for example, an array configuration similar to the TFT array 208 described above. Additionally, one or more acrylic materials may reside atop the traces of the touch sensor 106 for protection. Alternatively, the additional layer of OCA 214 disposed between the second portion 204 and the third portion 400 may provide sufficient protection, in which case, such acrylic materials may be omitted. It is understood that each of the traces of the touch sensor 106 may be connected to the PCB 402 and/or to the touch controller 108.

While FIGS. 2-4 illustrate two example stacks, other implementations may utilize the same or different components in the same or different orders. For instance, one implementation may include the touch sensor 106 on top of the transparent substrate 206 (with or without the antiglare component 116), such as on the surface C, or on the bottom of the transparent substrate 206, such as on the surface D. In a further implementation, the touch sensor 106 may be integrated with the antiglare component 116 on the top surface C of the transparent substrate 206. Additionally, the frontlight 114 may reside under the touch sensor 106, with the display 102 residing underneath the frontlight 114. Furthermore, in some examples, the device 100 may not include a frontlight 114.

Figure 5:
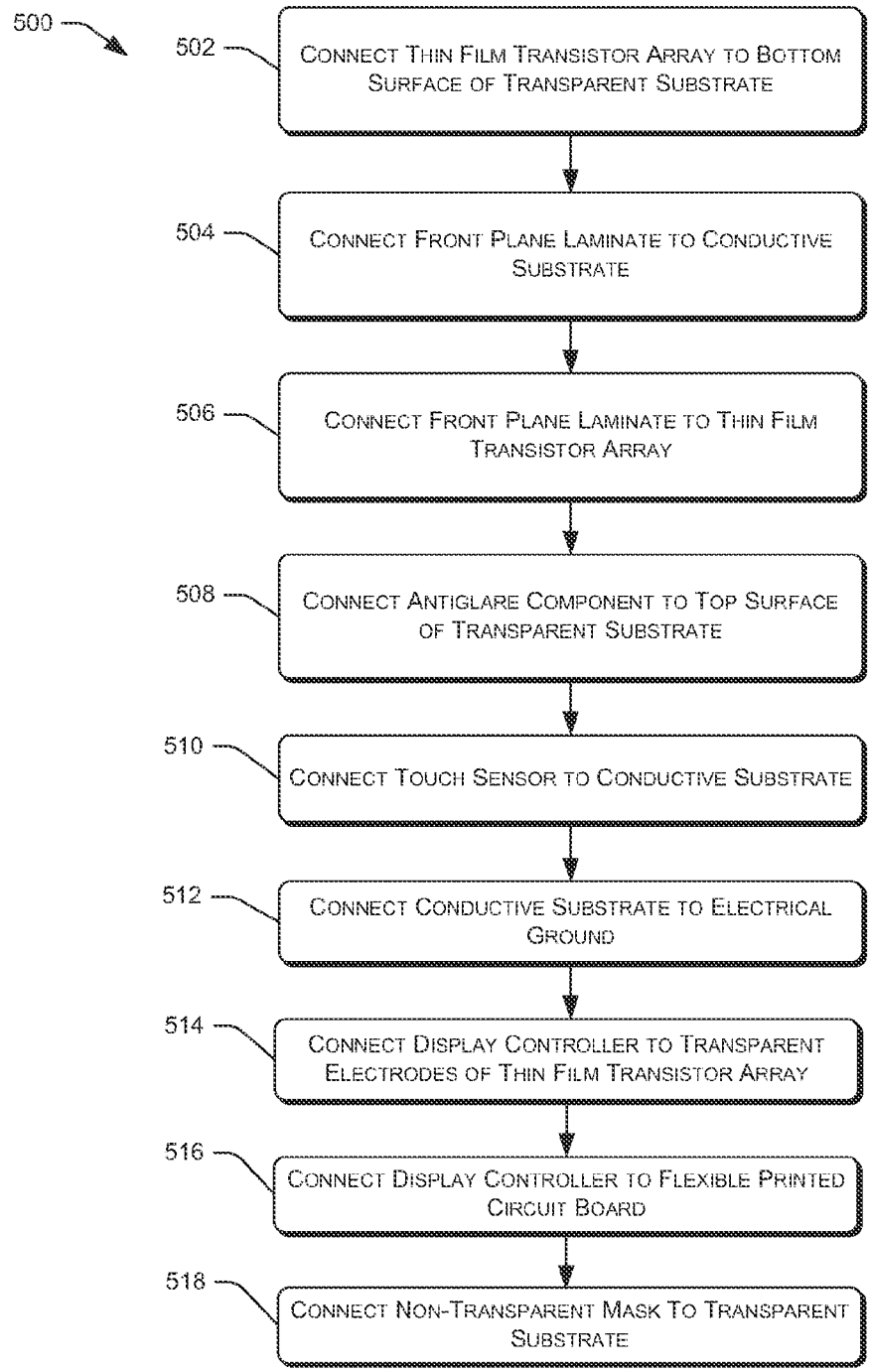
FIG. 5 shows an example flow diagram illustrating an example method of manufacturing an electronic device having a display.

FIG. 5 illustrates an example method 500 of assembling and/or otherwise manufacturing an electronic device 100 including the display 100 described herein. The order in which the operations are described is not intended to be construed as a limitation, and any number of the described operations can be combined in any order and/or in parallel to implement the process. Further, the process of orienting and/or otherwise disposing any of the components described above in their relative disclosed orientations may be incorporated into any of the operations illustrated in the method 500.

The method 500 includes, at 502, contacting a TFT array 208 to the transparent substrate 206. For example, the TFT array 208 may be connected to the bottom surface D of the transparent substrate 206, and as a result, the TFT array 208 may be positioned closer to the location B internal to the electronic device 100 than the transparent substrate 206 once the display 102 has been disposed within the electronic device 100.

At 504, the FPL 216 may be connected to the conductive substrate 218. For example, the FPL 216 may be connected to the first (i.e., top) surface E of the conductive substrate 218. Accordingly, in example embodiments, the first portion 202 may be manufactured at 502 while the second portion 204 may be manufactured at 504.

At 506, the first portion 202 may be connected to the second portion 204, and in this way, manufacture of the display 102 may be a relatively streamlined process. For example, at 506 the FPL 216 may be connected to the TFT array 208 via the OCA 214 disposed therebetween. It is understood that any of the curing processes described above with respect to the OCA 214 may be utilized at 506 to facilitate connecting the FPL 216 to the TFT array 208. At 508, the antiglare component 116, such as an antiglare film 200 may be connected to the top surface C of the transparent substrate 206. For example, the antiglare component 116 may be connected to the top surface C using another layer of OCA 214 and/or via any other like method.

At 510, a touch sensor 106, such as a capacitive touch sensor, maybe connected to the conductive substrate 218. For example, as described with respect to FIG. 4, the touch sensor 106 may be connected to a second (i.e., bottom) surface F of the conductive substrate 218 via an additional layer of OCA 214. Although not specifically illustrated in FIG. 5, in such embodiments, the touch controller 108 may be connected to the PCB 402 at 510. Further, at 510 the touch controller 108 may be connected to the touch sensor 106 and/or to one or more processors 110 of the electronic device 100. Additionally, at 512, the conductive substrate 218 may be connected to electrical ground. Such electrical ground may comprise, for example, a portion and/or a component of the electronic device 100.

At 514, the display controller 104 and/or other components of the PCB 212 may be connected to the transparent electrodes 300, 302 of the TFT array 208. Additionally, at 516, the display controller 104 may be connected to the PCB 212. Although the display controller 104 has been described herein as being connected to the PCB 212, in further embodiments, the display controller 104 may be connected to the transparent substrate 206, such as to the bottom surface D. In such embodiments, the display controller 104 may also be connected to the PCB 212. Such connections may be made at 516. It is understood that the display controller 104 may also be connected to the electrodes 300, 302 and/or two the one or more processors 110 at 516. Finally, at 518, the non-transparent mask 210 may be connected to the bottom surface D of the transparent substrate 206.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

The invention claimed is:

1. An electronic device comprising;
   one or more processors;
   memory;
   a content presentation application, stored in the memory and executable on the one or more processor to cause display of a content item; and
   a display configured to display the content item, the display comprising:
   a transparent glass substrate having a bottom surface facing a location internal to the electronic device, and a top surface opposite the bottom surface, wherein the transparent glass is a cover glass for the display, the content item being visible on the display via the top surface of the transparent glass substrate,
   a thin film transistor (TFT) array comprising a plurality of transparent electrodes, at least one electrode of the plurality of transparent electrodes disposed on the bottom surface of the transparent glass substrate,
   a conductive substrate,
   a front plane laminate (FPL) connected to the conductive substrate, the FPL comprising at least one capsule housing a plurality of charged particles, each particle of the plurality of charged particles being movable within the at least one capsule, and
   a layer of optically clear adhesive (OCA) connecting the FPL to the TFT array,
   wherein at least one electrode of the plurality of transparent electrodes is operable to drive movement of at least one particle of the plurality of charged particles.

2. An electronic device as recited in claim 1, further comprising:
   a capacitive touch sensor configured to receive touch input via the transparent glass substrate, and
   a touch controller connected to the capacitive touch sensor, the touch controller being configured to receive signals from the capacitive touch sensor indicative of the touch input, and to control operation of the at least one electrode based at least partially on the signals.

3. An electronic device as recited in claim 1, further comprising a non-transparent mask connected to the bottom surface of the transparent glass substrate, the non-transparent mask being configured to substantially block light from passing through a portion of the transparent glass substrate.

4. An electronic device as recited in claim 1, wherein the plurality of transparent electrodes comprises a first plurality of indium tin oxide (ITO) electrodes disposed in a first plane, and a second plurality of ITO electrodes disposed in a second plane substantially parallel to the first plane, at least one electrode of the first plurality of ITO electrodes being oriented approximately 90 degrees from at least one electrode of the second plurality of ITO electrodes,
   wherein the first and second planes are disposed substantially parallel to the bottom surface of the transparent glass substrate, and
   wherein a node of the TFT array is formed at each respective location in which an electrode of the first plurality of ITO electrodes overlays an electrode of the second plurality of ITO electrodes.

5. The electronic device of claim 1, wherein the transparent glass substrate and the TFT are manufactured as one element, and the FPL and conductive substrate are manufactured as a separate element.

6. The electronic device of claim 1, wherein the OCA is formed from an acrylic material or silicone.

7. The electronic device of claim 1, wherein the conductive substrate is made from at least one of aluminum, copper, titanium, or gold.

8. The electronic device of claim 1, wherein the plurality of charged particles comprises a first plurality of particles having a first color and a second plurality of particles having a second color different from the first color, the first plurality of particles having a first electrical charge and the second plurality of particles having a second electrical charge opposite from the first electrical charge.

9. The electronic device of claim 1, wherein the display includes a lightguide that propagates light form a light source to illuminate the display.

10. The electronic device of claim 9, wherein the lightguide comprises a substrate, a layer of lacquer, and a plurality of grating elements.

11. A display, comprising:
    a first substrate having a top surface and a bottom surface opposite the top surface, wherein the first substrate is a cover glass for the display;
    a thin film transistor (TFT) array, the TFT array comprising a plurality of transparent electrodes, and at least one electrode of the plurality of transparent electrodes disposed on the bottom surface of the transparent substrate;
    a second substrate comprising a substantially conductive material; and
    a front plane laminate (FPL) connected to the second substrate and the TFT array, the FPL comprising a plurality of charged particles moveable relative to the second substrate and visible on the display via the top surface of the first substrate, wherein
    the plurality of transparent electrodes is operable to drive movement of at least one particle of the plurality of charged particles.

12. A display as recited in claim 11, further comprising an antiglare component connected to the top surface of the first substrate.

13. A display as recited in claim 11, wherein the plurality of transparent electrodes comprises a first plurality of electrodes and a second plurality of electrodes, each electrode of the first plurality of electrodes extending substantially parallel to at least one adjacent electrode of the first plurality of electrodes, and each electrode of the second plurality of electrodes extending substantially parallel to at least one adjacent electrode of the second plurality of electrodes.

14. A display as recited in claim 13, wherein at least one electrode of the first plurality of electrodes is oriented approximately 90 degrees from at least one electrode of the second plurality of electrodes, and wherein the first and second plurality of electrodes are disposed substantially parallel to the bottom surface of the first substrate.

15. A display as recited in claim 11, wherein each electrode of the plurality of transparent electrodes is made from at least one of indium tin oxide (ITO), carbon nanotubes, or silver nanowire.

16. A display as recited in claim 11, wherein the plurality of charged particles comprises a first plurality of particles having a first color and a second plurality of particles having a second color different from the first color, the first plurality of particles having a first electrical charge and the second plurality of particles having a second electrical charge opposite from the first electrical charge, wherein varying a polarity at a portion of the TFT array drives movement of the first and second pluralities of particles.

17. A display as recited in claim 11, wherein the second substrate comprises a first surface and a second surface opposite the first surface, the FPL being connected to the first surface of the second substrate, the display further comprising a capacitive touch sensor configured to receive a touch input, the capacitive touch sensor being connected to the second surface of the second substrate.

18. A display as recited in claim 17, further comprising:
a flexible printed circuit board (PCB); and
a touch controller mounted to the flexible PCB and connected to the touch sensor, the touch controller being configured to control display of a content item on the display in response to the touch input.

19. A display as recited in claim 11, further comprising:
a flexible printed circuit board (PCB); and
a display controller mounted to the flexible PCB and connected to the plurality of transparent electrodes, wherein the display controller is configured to vary a polarity of a voltage applied to at least one electrode of the plurality of transparent electrodes, and wherein varying the polarity of the voltage drives movement of at least a portion of the plurality of charged particles.

20. A display as recited in claim 11, further comprising a non-transparent mask connected to the bottom surface of the first substrate, the non-transparent mask comprising at least one of glue, ink, paint, or tape configured to substantially block light from passing through a portion of the first substrate.

* * * * *